United States Patent
Trüssel et al.

(10) Patent No.: US 11,362,008 B2
(45) Date of Patent: Jun. 14, 2022

(54) POWER SEMICONDUCTOR MODULE EMBEDDED IN A MOLD COMPOUNDED WITH AN OPENING

(71) Applicant: Hitachi Energy Switzerland AG, Baden (CH)

(72) Inventors: Dominik Trüssel, Bremgarten (CH); Samuel Hartmann, Staufen (CH); David Guillon, Vorderthal (CH)

(73) Assignee: HITACHI ENERGY SWITZERLAND AG, Baden (CH)

( * ) Notice: Subject to any disclaimer, the term of this patent is extended or adjusted under 35 U.S.C. 154(b) by 0 days.

(21) Appl. No.: 16/737,378

(22) Filed: Jan. 8, 2020

(65) Prior Publication Data

US 2020/0144140 A1     May 7, 2020

Related U.S. Application Data

(63) Continuation of application No. PCT/EP2018/068604, filed on Jul. 10, 2018.

(30) Foreign Application Priority Data

Jul. 12, 2017 (EP) .................................... 17181052

(51) Int. Cl.
   *H01L 23/08*    (2006.01)
   *H01L 21/48*    (2006.01)
   (Continued)

(52) U.S. Cl.
   CPC ............ *H01L 23/08* (2013.01); *H01L 21/481* (2013.01); *H01L 21/565* (2013.01);
   (Continued)

(58) Field of Classification Search
   CPC ...................................................... H01L 23/08
   (Continued)

(56) References Cited

U.S. PATENT DOCUMENTS 6,353,258 B1  3/2002 Inoue et al.
7,902,653 B2  3/2011 Horio et al.
(Continued)

FOREIGN PATENT DOCUMENTS

CN    101615601 A     12/2009
DE    102008023711 A1 11/2008
(Continued)

OTHER PUBLICATIONS

European Patent Office, International Search Report & Written Opinion issued in corresponding Application No. PCT/EP2018/068604, dated Nov. 12, 2018, 15 pp.
(Continued)

*Primary Examiner* — Ajay Arora
(74) *Attorney, Agent, or Firm* — Slater Matsil, LLP

(57) ABSTRACT

The present invention provides a power semiconductor module, including a substrate having an electric insulating main layer being provided with a structured top metallization and with a bottom metallization, wherein the top metallization is provided with at least one power semiconductor device and at least one contact area, wherein the main layer together with its top metallization and the at least one power semiconductor device is embedded in a mold compound such that the mold compound includes at least one opening for contacting the at least one contact area, and wherein power semiconductor module includes a housing with circumferential side walls, wherein the side walls are positioned above the main layer of the substrate so that the side walls are only present in a space above a plane through the main layer of the substrate.

20 Claims, 4 Drawing Sheets

(51) Int. Cl.
*H01L 21/56* (2006.01)
*H01L 23/14* (2006.01)
*H01L 23/29* (2006.01)
*H01L 23/31* (2006.01)

(52) U.S. Cl.
CPC ............ *H01L 23/142* (2013.01); *H01L 23/29* (2013.01); *H01L 23/3178* (2013.01)

(58) Field of Classification Search
USPC ........................................................ 257/693
See application file for complete search history.

(56) References Cited

U.S. PATENT DOCUMENTS

| | | | |
|---|---|---|---|
| 9,136,193 | B2 | 9/2015 | Minamio et al. |
| 10,381,283 | B2 | 8/2019 | Osterwald et al. |
| 2002/0100986 | A1* | 8/2002 | Soga ........................ H01L 24/32 257/779 |
| 2004/0027788 | A1* | 2/2004 | Chiu ...................... H01L 21/563 361/329 |
| 2004/0089931 | A1 | 5/2004 | Nakajima et al. |
| 2005/0237722 | A1* | 10/2005 | Hable ................. H01L 23/4334 361/728 |
| 2008/0203559 | A1 | 8/2008 | Lee et al. |
| 2009/0039498 | A1 | 2/2009 | Bayerer |
| 2010/0013085 | A1 | 1/2010 | Oi et al. |
| 2010/0053889 | A1* | 3/2010 | Miller .................. H01L 23/4735 361/689 |
| 2010/0065962 | A1* | 3/2010 | Bayerer .................... H05K 3/44 257/703 |
| 2010/0133681 | A1 | 6/2010 | Oka et al. |
| 2010/0133684 | A1 | 6/2010 | Oka et al. |
| 2013/0277819 | A1 | 10/2013 | Yoshida |
| 2015/0092380 | A1* | 4/2015 | Hohlfeld .................. H05K 1/11 361/783 |
| 2016/0254255 | A1 | 9/2016 | Hori et al. |
| 2017/0025344 | A1 | 1/2017 | Kanai |
| 2019/0006269 | A1* | 1/2019 | Xu ...................... H01L 21/4882 |
| 2019/0067154 | A1* | 2/2019 | Yoshihara ............... H01L 21/56 |

FOREIGN PATENT DOCUMENTS

| | | | |
|---|---|---|---|
| DE | 102015112451 A1 | 2/2017 | |
| EP | 0962974 A2 | 12/1999 | |
| EP | 3518278 A1 * | 7/2019 | ........... H01L 23/295 |
| JP | 2011187819 A | 9/2011 | |
| JP | 2014179376 A | 9/2014 | |
| WO | 2013121491 A1 | 5/2015 | |

OTHER PUBLICATIONS

Sakai et al., "Power cycle lifetime improvement by reducing thermal stress of a new dual HVIGBT module," Mitsubishi Electric Corporation, EPE'16 ECCE Europe, ISBN: 9789075815252, 7 pp.

* cited by examiner

POWER SEMICONDUCTOR MODULE EMBEDDED IN A MOLD COMPOUNDED WITH AN OPENING

TECHNICAL FIELD

The present invention relates to a power semiconductor module. The present invention especially refers to a power semiconductor module which shows a good long-life reliability, good performance and which is producible at low costs.

BACKGROUND ART

Power semiconductor modules comprising power semiconductor devices, such as switching power semiconductor devices, are generally known in the art. It may be important for specific applications to protect power semiconductor devices mechanically and/or with regard to environmental factors in order for the module to work reliably for a long time.

US 2010/0133684 A1 describes a power semiconductor module including: a circuit board having a metal base plate, a high thermal conductive insulating layer, and a wiring pattern; power semiconductor elements electrically connected to the wiring pattern; tubular external terminal connection bodies provided to the wiring pattern for external terminals; and a transfer mold resin body encapsulated to expose through-holes in the metal base plate and used to fixedly attach cooling fins to the face of the metal base plate on the other side with attachment members, the face of the metal base plate on the other side, and top portions of the tubular external terminal connection bodies, to form insertion holes for the attachment members communicating with the through-holes and having a larger diameter than the through-holes, and to cover the one side and side faces of the metal base plate and the power semiconductor elements.

JP2011-187819 A describes a resin sealed power module including an insulating board, a power semiconductor element arranged on the insulating board, a plurality of hollow cylindrical sockets arranged on the insulating board, and a resin case in which a plurality of recesses is formed on its upper surface, and is so formed as to cover the power semiconductor element and the plurality of hollow cylindrical sockets. The plurality of hollow cylindrical sockets is exposed from the plurality of recesses in such manner as a single hollow cylindrical socket among the plurality of hollow cylindrical sockets is exposed from a single recess among the plurality of recesses.

US 2008/0203559 A1 describes a power device package coupled to a heat sink using a bolt and a semiconductor package mold for fabricating the same. The power device package includes: a substrate; at least one power device mounted on the substrate; a mold member sealing the substrate and the power device; and at least one bushing member fixed to the mold member to provide a through hole for a bolt member for coupling a heat sink to the mold member.

WO 2013/121491 A1 describes a semiconductor device including a package, a block-module, and a control board for controlling power semiconductor elements. The block-module has embedded power semiconductor elements and second leads and first leads that are drawn from the block-module. The package has external connection terminals in contact with the first leads of the block-module. The second leads are connected to the control board while the first leads are joined to the external connection terminals.

DE 10 2015 112 451 A1 describes a power semiconductor module, comprising: a substrate; a semiconductor provided on a top side of the substrate; and a package formed on the semiconductor and the substrate, wherein the package has openings at a top side thereof, through which terminal contacts of the semiconductor and the substrate are exposed outside and accessible from outside.

CN101615601 A relates to a vertically upward contact semiconductor with a lead frame, which comprises a base plate, a semiconductor arranged on the substrate, and an electric contact. The contact is formed as a contact body protruded at one side below a connection plane from the base plate, and the contact is at least partially arranged in an injected molding material around the semiconductor.

US 2010/0013085 A1 discloses a power semiconductor device including power semiconductor elements joined to wiring patterns of a circuit substrate, cylindrical external terminal communication sections, and wiring means for forming electrical connection between, for example, the power semiconductor elements and the cylindrical external terminal communication sections. The power semiconductor elements, the cylindrical external terminal communication sections, and the wiring means are sealed with transfer molding resin. The cylindrical external terminal communication sections are arranged on the wiring patterns so as to be substantially perpendicular to the wiring patterns, such that external terminals are insertable and connectable to the cylindrical external terminal communication sections, and such that a plurality of cylindrical external terminal communication sections among the cylindrical external terminal communication sections are arranged two-dimensionally on each of wiring patterns that act as main circuits.

US 2004/0089931 A1 relates to a small-sized, lightweight, low-cost power semiconductor device with excellent productivity and vibration resistance. A mold resin casing is made of a thermosetting resin, such as epoxy resin, and has a top surface and a bottom surface. A through hole is formed in a non-peripheral portion of the mold resin casing to pass through between the top surface and the bottom surface. Electrodes have their first ends projected from sides of the mold resin casing. The bottom surface of a heat spreader is exposed in the bottom surface of the mold resin casing. The heat spreader has an opening formed around the through hole.

DE 10 2008 023 711 A1 relates to a semiconductor module including a first metal foil; an insulating sheet mounted on a top surface of the first metal foil; at least one second metal foil mounted on a top surface of the insulating sheet; at least one semiconductor device mounted on the second metal foil; and a resin case for surrounding the first metal foil, insulating sheet, second metal foil, and semiconductor device. A bottom end of a peripheral wall of the resin case is located above a bottom surface of the first metal foil. A resin is provided inside the resin case to fill the inside of the resin case. The bottom surface of the first metal foil and the resin form a flat bottom surface so that the flat bottom surface contacts an external mounting member.

U.S. Pat. No. 7,902,653 B2 describes a semiconductor module including a first metal foil; an insulating sheet mounted on a top surface of the first metal foil; at least one second metal foil mounted on a top surface of the insulating sheet; at least one semiconductor device mounted on the second metal foil; and a resin case for surrounding the first metal foil, insulating sheet, second metal foil, and semiconductor device. A bottom end of a peripheral wall of the resin case is located above a bottom surface of the first metal foil. A resin is provided inside the resin case to fill the inside of the resin case. The bottom surface of the first metal foil and the resin form a flat bottom surface so that the flat bottom surface contacts an external mounting member.

JP 2014-179376 A describes a semiconductor device comprising: a circuit board on which a semiconductor element is mounted; a base plate on which the circuit board is mounted; and a resin housing which encapsulates the components such as the semiconductor element, the circuit board and the base plate, and which has a first surface and an opposed second surface. The resin housing has a through hole and a cylindrical member inside which is composed of a material having rigidity higher than that of a material composing the resin housing. A rear face of the base plate is exposed on the first surface of the resin housing. One end of the cylindrical member is exposed on the second surface of the resin housing.

Yasuhiro Sakai et. al: *Power cycling lifetime improvement by reducing the thermal stress of a new dual HVIGBT module*, EPE'16 ECCE Europe, ISBN: 9789075815252, CFP16850-USB further describes the so called MCB (Metal Casting direct Bonding) in which a ceramic substrate is directly joined to a baseplate, and thereby the solder layer between the substrate and the baseplate is eliminated. In addition, the solder between the chip and the substrate is realized by a Sn—Sb solder.

US 2016/254 255 A1 shows a power semiconductor module with a circuit board, which is embedded in a resin. A frame body is positioned on a base plate to which the circuit board is connected with a bottom side. A cover is arranged on the frame body and the circuit board, which cover has pipes, which are used for guiding terminals to contacts on the circuit board.

U.S. Pat. No. 6,353,258 B1 relates to a power semiconductor module with a substrate, which carries semiconductor chips. The substrate is connected to a metal plate, onto which a case is connected, which covers the substrate. A volume inside the case is filled with a silicone gel.

The solutions of the prior art, however, still give room for improvements, for example regarding providing an effective measure against negative influences acting on the power semiconductor devices and thus regarding the long-life reliability.

DISCLOSURE OF INVENTION

It is an object of the present invention to provide a power semiconductor module which overcomes at least one drawback of the prior art. It is in more detail an object of the present invention to provide a power semiconductor module which shows a high long-life reliability, or long-term reliability, respectively, shows a good performance and/or is cost-saving to form.

These objects are at least partly solved by a power semiconductor module according to independent claim 1. Advantageous embodiments of the present invention are given in the dependent claims, in the further description as well as in the figures, wherein different embodiments can, alone or in any combination, provide a feature of the present invention unless not clearly excluded.

The present invention provides a power semiconductor module, comprising a substrate having an electric insulating main layer being provided with a structured top metallization and with a bottom metallization, wherein the top metallization is provided with at least one power semiconductor device and at least one contact area, wherein the main layer together with its top metallization and the at least one power semiconductor device is embedded in a mold compound such, that the mold compound comprises at least one opening for contacting the at least one contact area, and wherein power semiconductor module comprises a housing with circumferential side walls, wherein the sidewalls are positioned above the main layer.

Such a power semiconductor module provides an effective and long-term reliable protection. It may thereby be formed in a cost-saving manner and may further show a good performance. In detail, significant advantages with regard to reliability especially referring to humidity problems may be achieved.

In particular, the side walls are connected onto the mold compound, such that the sidewalls are positioned above the main layer. It has to be noted that the housing is connected to the mold compound. The housing may be directly connected to the mold compound and/or may be not necessarily directly connected to the substrate.

Furthermore, the side walls are positioned above the main layer, which may mean that the side walls are only present in a space above a plane through the main layer.

According to an embodiment of the invention, the circumferential side walls are connected to a top side of the mold compound. The mold compound may be seen as a casing of the substrate and/or the power semiconductor power. The mold compound may comprise a substantially plane top side. The opening to the at least one contact area may be provided in the top side. The circumferential side walls may be connected to a circumferential border of the top side.

Furthermore, The mold compound may comprise a bottom side, which may be flush with a bottom side of the bottom metallization.

According to an embodiment of the invention, the circumferential side walls are spaced apart from the substrate by the mold compound in a direction orthogonal to a plane parallel to the substrate. Thus, a peripheral side of the mold compound (which may be aligned substantially orthogonal to the a top and/or bottom side) may provide an outer side of the power semiconductor module.

According to an embodiment of the invention, an extension area of the substrate overlaps an extension area of the circumferential side walls, when projected onto a plane parallel to the substrate. For example, the bottom metallization may have a larger extension area as the main layer and/or the top metallization. The extension area of the circumferential side walls may overlap the bottom metallization. It has to be noted that a bottom face of the circumferential side walls may define the extension area of the circumferential side walls. With this bottom face, the circumferential side walls may be connected to the mold compound.

The present invention refers to a power semiconductor module, or power transistor module, respectively. The power semiconductor module comprises a substrate with an electric insulating main layer being provided with a structured top metallization and with a bottom metallization. The term insulating shall thereby in a non-limiting manner mean electrical resistive properties which allow the module to work properly as known in the art. As a non-limiting example, a typical resistivity of the electrically insulating material is in the range of equal or more than $10^9$ Ohm*cm. Such an arrangement is generally known in the art and may comprise for example a ceramic material as electrically insulating main layer.

The main layer is provided with a bottom metallization on its lower side especially in order for thermally connecting the substrate to a cooler. Further, a top metallization is provided which metallization is structured in order to form an electrical circuit, for example by the provision of respective conductors formed by the metallization. Accordingly, the top metallization is provided with at least one power semiconductor device or in other words, the at least one power semiconductor device is electrically connected to the top metallization. Further at least one contact area is provided for externally contacting the at least one power semiconductor device, or the electric circuit, respectively for example by means of one or more respective terminals or connectors, such as terminal pads. In detail, it may be provided that the top metallization may carry one or more than one power semiconductor devices and may further comprise one or more than one contact area.

Regarding the power semiconductor devices, it might be provided that one or a plurality of transistors, or switching devices, respectively, is provided, such as insulated-gate bipolar transistor (IGBT) devices, metal oxide semiconductor field-effect transistors (MosFET), diodes, and/or the like.

It is further provided that the main layer together with its top metallization and the provided power semiconductor devices is embedded in a mold compound such, that the mold compound comprises at least one opening for contacting the at least one contact area. In other words, a mold compound is provided which surrounds the main layer and additionally the top metallization and the provided power semiconductor devices and preferably at part the bottom metallization. The substrate may thus be essentially fully embedded in the mold compound except the openings which expose the at least one contact area and parts of the bottom metallization. The one or more power semiconductor devices, however, together with their electrical connections are preferably fully embedded in the mold compound.

It may for example be provided that the provided power semiconductor devices are at least partly contacted by wire bonds, i.e. at least some connections are realized by wire bonds. For example, the wire bonds may proceed to a further part of the top metallization, such as to a contact area. Thus, the power semiconductor device is, for example together with its bonding positions and the bonding wires, fully embedded in the mold compound.

According to this, a protection of the electronic circuit, with regard to outer influences, such as mechanical influences or humidity, may be improved very effectively. The essentially full embedding of the electronic circuit together with e.g. wire bonds gives further reliability as such bonding positions may under circumstances be susceptible for damages or for degradations, so that it may be provided that these positions are secured by the mold compound. Therefore, reliability with regard to mechanical influences and/or humidity is largely improved. In power modules, such as comprising IGBT-devices as power semiconductor devices, especially humidity stress may be a risk regarding reliability problems so that counteracting this problem may in an advantageous manner improve the module.

The before-described arrangement may further improve creepage distances. Especially due to the fact that the power semiconductor devices are fully embedded in the mold compound the creepage distance may be improved as the termination of the semiconductor chips and the ceramics of the insulating substrate are covered by the mold compound. Thus, a life time increase of wire bonds and solder joints done with the sealing material may be realized.

Further, due to the fact that the mold compound comprises at least one opening for contacting the at least one contact area, which may be designed for receiving a terminal plate, for example, significant advantages may be provided. In case a terminal plate and thus a terminal, such as a copper power terminal, is positioned on the contact area, the terminal plate may be spaced from the mold compound. In other words, it may be provided that the mold compound is not in direct contact to a terminal plate, or terminal, respectively. According to this, the risk of exerting mechanical stress from the terminal, such as formed from copper, or from its lead, such as copper lead, which is seen as part of the terminal, to the mold compound may be avoided. Therefore, the long-term reliability of the power semiconductor module as described may be further improved. Apart from that, the connectivity of the terminal, such as collector, emitter and auxiliary terminals, is significantly improved as it may be connected comparably easy and without spatial hindrance of the mold compound.

Apart from that, in case the mold compound is applied before connecting the terminal, the latter may be placed on the respective contact area without having any danger of negatively influencing the electrical circuit or at least the parts being embedded in the mold compound. For example, the arrangement of the power module is without any problems compatible to welding techniques. The concerns of cross contamination from terminal bonding techniques are less critical since most of the sensitive regions may already be protected by the mold compound before performing bonding techniques, such as by bonding the emitter, such as at an IGBT.

Therefore, the production of the power semiconductor module is further simplified and the long-term reliability is further improved.

The contact area which is free after placing the terminal plate may be embedded in additional electrically insulating material like will be shown below.

Apart from the above, it is provided that the power semiconductor device comprises a housing with circumferential side walls, wherein the sidewalls are positioned above the main layer. The latter shall mean that the side walls are positioned on top of the main layer. It may be that a bottom face of the side walls is positioned in one plane with the main layer, the latter plane particularly proceeding rectangular to the main plane of the main layer.

This arrangement may additionally provide significant advantages. In detail, at first the housing may provide additional mechanical stability regarding the periphery which is provided at the top of the substrate, or the mold compound, respectively. Apart from that, it may be provided that positioned on top of the mold compound is an additional electrical insulative material. This may additionally improve the resistance against humidity, for example, like it is described in detail down below. Therefore, the long-term resistance and thus the reliability may further be improved.

Further, due to the fact that the sidewalls are positioned above the main layer, and thus onto the main layer but not next to the main layer, a superior performance may be achieved. This may be mainly due to the fact that it is not required to provide lateral space for placing the housing around the substrate which allows increasing the active area and thus the performance properties of the module. Therefore, substrates can be larger in each direction, for example in a range of 6 mm per direction. Apart from that, this embodiment allows an especially mechanical stable arrangement so that this embodiment may allow an especially high long-term reliability.

Regarding the mold compound, even for harsh conditions, the transfer molding technology or compression molding technology for providing a mold compound shows promising results with respect to humidity resistance. For example when using an Epoxy-Mold Compound (EMC), such as epoxy resins as sealing material, good results can be achieved. Therefore, for example, the transfer molding process or compression molding process can be realized for applying the mold compound. A material which is applied in such a manner may provide superb mechanical stability as well as electronic insulating properties. Openings which are free of mold compound on the substrate metallization may easily be provided for the output electrical connection, or external connectors, respectively, at the contact areas like indicated above.

Such a power semiconductor module can thus be implemented in today's standard power modules and thus shows a superb applicability. Due to the independence of the specific design, the power semiconductor module shows a very high design flexibility by requiring low costs which strengthens the applicability.

Further, the creepage and the insulation distance may be improved against prior art solutions, which additionally improves the electric properties as well as applicability of a power semiconductor module as described before.

A power semiconductor module as described before further allows an improved applicability, as one arrangement or one technology, respectively, may suit a plurality of different modules. With this regard, it may be provided that the CTE of the mold compound, for example of an epoxy mold compound, such as an epoxy resin, can be adjusted to minimize bending of the module during operation. Therefore, the development and the production of such different power semiconductor modules may be realized especially cost-saving.

With this regard, it has to be noted that the substrate with its mold compound may replace an arrangement comprising a substrate fixed to a baseplate according to the solution of the prior art. In detail, the comparably expensive AlSiC base plate with substrates soldered to it may be exchanged by a substrate according to the invention, which allows saving of material costs thereby reaching at least comparable properties.

The provision of the mold compound at the substrate further realizes an especially high mechanical stability without the need of reinforcement ceramics in base plate, as already due to the mold compound a high mechanical stability may be reached.

Further, such power semiconductor modules may provide especially high current ratings so that the applicability even for usages having especially high requirements may be reached. As an example, a 6.5 kV module with 300 A current rating is possible instead of 240 A with conventional technologies according to the prior art.

Apart from the above, a high thermal power cycling capability may be reached for example due to no or less solders with further improves the long-term reliability of the power modules as described above. The latter may be additionally improved due to the fact that the thermal resistance junction to the case is lower compared for example to the classical AlSiC based modules.

It may be provided that the openings are filled with an electrical insulator, in particular after having positioned the respective periphery therein such as terminals. It may advantageously be provided that next to the openings, the housing is filled with said electrical insulator and therefore the top surface of the mold compound is provided with the insulator. The insulator may for example comprise or be formed from silicone gel or epoxy resin, for example epoxy potting resin. Therefore, the electrical insulator is located inside the housing and on top of mold compound. This embodiment may provide significant advantages over the prior art as it provides a secure protection of the electronic circuit on substrate level as well as on chip level.

This may be mainly due to the fact that by providing the mold compound the respective parts under circumstances cannot be fully protected as it may be difficult to ensure that all desired positions of the support and the power semiconductor device or further parts of the respective electronic circuit are effectively covered by the mold compound. This may be caused for example by actual designs of power modules as these only are known to be filled with silicone gel which may simply be poured into a housing without having an essential need of taking measures for ensuring a complete filling of the housing. These actual designs, however, are generally not provided with a mold compound as the design is optimized for pouring and hardening an insulating material.

A power semiconductor module according to this embodiment, however, overcomes this disadvantage as it is no longer detrimental in case the mold compound is not fully provided at the respective positions. The further insulating material, i.e. the silicone gel or the epoxy resin, will address the problems arising therewith. It may be provided that the housing is fully filled with the insulating material or electrical insulator, respectively, such as silicone gel, even though this is not mandatory and according to the specific application it may be sufficient to only partly fill the housing frame or even only the openings with the electrical insulator, or protective material, respectively.

Further, solutions comprising only a mold compound are often hard to apply with complex structures, so that the combination of a mold compound and an insulating material being exemplarily formed from silicone gel may be very effective according to this embodiment.

Taking the above, the present invention goes a complete different way compared to todays solutions. In today applications, it is mainly tried to substitute completely the silicone gel to sealing materials wherein the power module packaging is the challenge to keep the internal creepage distance between the main potential collector and emitter/gate due to the high insulation properties of the mold body. According to the power module as described in this embodiment, however, the silicone gel is not substituted by a sealing material but both materials are used in a combination showing improved properties.

It was further found that especially this embodiment may be advantageous for power modules having especially high performance data. For example, for power modules with a voltage rating of 3.3 kV and higher a further insulation material like a silicone gel filled into the frame is highly advantageous in order to achieve the needed creep distances between the different electric potentials.

It may further be provided that fixing rings, or fastening rings, respectively, for fixing the substrate to a cooler, such as a heat sink, are located in the mold compound. This allows an especially easy and adaptable manufacturing process as the fixing rings may be adapted for the desired needs very easily. For example, the fixing rings may be formed as metal rings. The fixing rings, or fastening rings, respectively, may be used for guiding screws therethrough for realizing a screw connection a cooler, such as a heat sink, that screws are screwed into the cooler. The mechanical fixing means may for example be realized at the four edges of the substrate in order to get a reliable connection. This embodiment may thus allow a high adaptability together with reduced costs and a long-term reliability.

It may further be provided that the substrate main layer is formed from a material selected from the group consisting of aluminum oxide ($Al_2O_3$), aluminum nitride (AlN), and silicon nitride (SiN). Especially the before named materials may provide good mechanical stability and thus long-term reliability in combination with a cost-saving production. As non-limiting examples, the main layer may be formed as follows. The main layer may be formed from zirconia doped aluminum oxide, for example in a thickness of 0.3 mm and it may provide a copper metallization as top metallization such as in the thickness of 0.6 mm. This example may allow especially low costs. As a further example, the main layer may be formed from silicon nitride, for example in a thickness of 0.32 mm to 1 mm and it may provide a copper metallization as top metallization such as in the thickness of 1.0 mm. This embodiment may allow an especially high voltage. As a further example, the main layer may be formed from aluminum nitride such as in a thickness of 0.63 to 1.0 mm with an aluminum metallization and an additional thick copper metallization on the aluminum on both sides. This may provide especially high voltage, high thermal performance, and high mechanical stability. Therefore, an overall thickness of up to 4 mm for the substrate may be reached.

Therefore, independently from the specific embodiment, it may be provided that the main layer has a thickness in the range of 0.2 mm to 2.0 mm, and/or the metallization, especially the top metallization and/or the bottom metallization like described below, may have a thickness in the range of ≥0.1 mm, such as from 0.1 mm to 1.5 mm, for example in the range of more than 0.5 mm to exemplarily smaller than 1.5 mm for showing a high performance.

Together or independently to the above, the metallization, especially the top metallization and/or the bottom metallization like described below may comprise or may be formed from copper, aluminum and/or from a multi-layer arrangement, for example formed from copper as one layer and aluminum as a further layer. For example but not limited thereto regarding to copper or the aluminum used, it may be provided that the latter metal is provided with a protection coating. Preferably, at least one of the top metallization and the bottom metallization may be nickel plated. Such a protection coating may give protection against oxidation and may further allow improvements in soldering steps.

It may further be provided that at least one terminal is welded to at least one contact portion of the top metallization. This embodiment may ensure a reliable connection method, wherein the disadvantages which may arise therewith are overcome when providing a module as described above. In detail, due to the fact that the mold compound may be provided before the welding step, detrimental effects due to the welding step, such as welding splashes or particle formation may be avoided. For example, ultrasonic welding may be used.

It may further be provided that the housing is connected to the mold compound by means of gluing or by means of a screw connection. Especially the before named techniques may secure a long-term reliability without negatively influencing the performance of the power module. With this regard, it may be provided that mechanical fixing means having for example an internal thread are positioned in the mold compound for realizing a respective screw connection. Alternatively, the sidewalls of the housing may be provided with an internal thread such and the mold compound may have respective throughholes such, that a screw can be guided through the mold compound and may be fixed in the housing, or its sidewalls, respectively.

It may further be provided that the housing is sealed against the mold compound, for example by means of rubber such as by a rubber basket. In other words, a sealing material is provided between the housing and the mold compound. This may further improve the long-term reliability as a direct contact between the mold compound and the housing frame and especially its sidewalls is prevented. In detail, due to the often present different values of thermal expansion (CTE) of the mold compound and the housing, according to this embodiment, the thermal cycling properties may be improved.

It may further be provided that an additionally to the mold compound, a protective coating is applied around the top metallization edges and thus between the metallization edges and the mold compound. According to this embodiment, the mold compound may thus embed both at least partly the top metallization and further the protective coating. For example, the protective coating may comprise or consist of polyimide. This embodiment may allow especially high performance data due to the fact that the creepage distance may be further improved.

It may further be provided that the bottom metallization is at least partly embedded in the mold compound. In other words, the mold compound may partly embed the bottom metallization but leaves one or more openings for realizing a direct contact of the bottom metallization with the cooler, such as a heat sink. According to this embodiment, an especially effective temperature management may be realized which further positively influences the long-term reliability as well as the possible performance date.

A further aspect of the invention relates to a method for manufacturing a power semiconductor module, such as the power semiconductor module as described in the above and in the below.

According to an embodiment of the invention, the method comprises: providing a substrate having an electric insulating main layer being provided with a structured top metallization and with a bottom metallization, wherein the top metallization is provided with at least one power semiconductor device and at least one contact area; embedding, in a first step, the main layer together with its top metallization and the at least one power semiconductor device in a mold compound such, that the mold compound comprises at least one opening for contacting the at least one contact area; and connecting, in a second step, a housing with circumferential side walls, onto the mold compound, such that the side walls are positioned above the main layer.

In other words, the substrate may firstly be embedded into the mold compound and the housing may be attached to the mold compound in a second step. It has to be noted that there may be no direct contact between the substrate and the housing.

To summarize, an arrangement of a power semiconductor module is described in order to overcome the drawbacks mentioned for the alternative packaging technologies in the prior art. It is provided a base plate being provided with a mold compound which realizes a mechanically stable arrangement, electrical insulation and moisture protection at the same time. A housing is mounted on top of the molded body. For further improving stability or for receiving an additional insulative material. Therefore, the power module allows a high long-term reliability due to high power cycling reliability, high mechanical stability as well as high resistance against moisture in combination with low costs and high performance data, such as a high current rating.

With regard to further advantages or features of the power semiconductor module, it is referred to the figures as well as to the description of the figures.

BRIEF DESCRIPTION OF DRAWINGS

These and other aspects of the invention will be apparent from and elucidated with reference to the embodiments described hereinafter.

In the drawings.

DETAILED DESCRIPTION OF THE INVENTION

Figure 1:
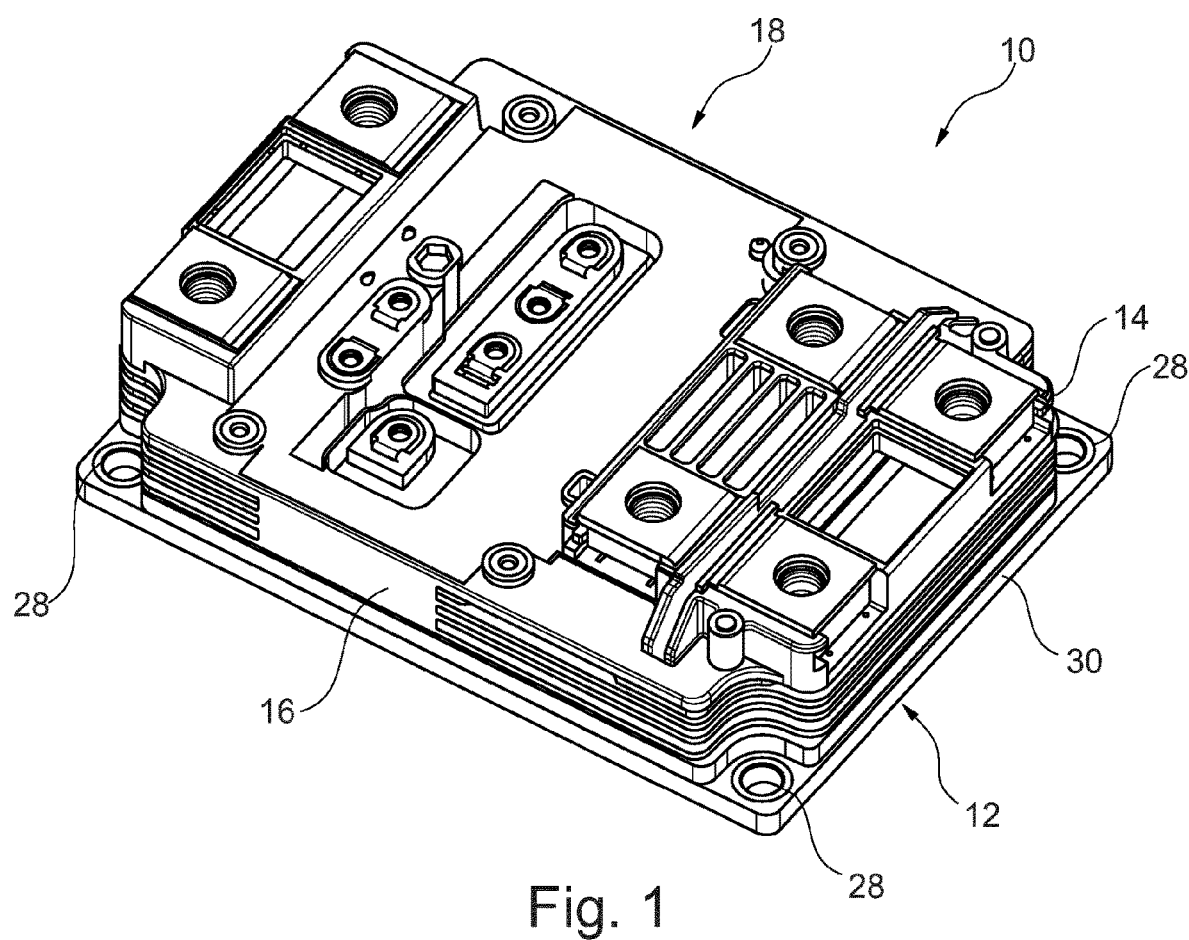
FIG. 1 shows a schematic view of an embodiment of a power semiconductor module.

Reference will now be made in detail to an exemplary embodiment, which is illustrated in the figures. This example is provided by way of explanation and is not meant as a limitation. It is intended that the present disclosure includes further modifications and variations.

Within the following description of the drawings, the same reference numbers refer to the same components. Generally, only the differences with respect to the individual embodiments are described. When several identical items or parts appear in a figure, not all of the parts have reference numerals in order to simplify the appearance.

FIG. 1 shows a power semiconductor module 10. The power semiconductor module 10 comprises a substrate 12 and a housing 14. The substrate 12 is shown in more detail in FIGS. 2 and 3. The housing 14 comprises circumferential side walls 16, like described in more detail below. Further, the housing comprises its active periphery 18 comprising for example respective terminals, such as main- and auxiliary terminals, like it is generally known in the art and is not described in detail here.

Figure 2:
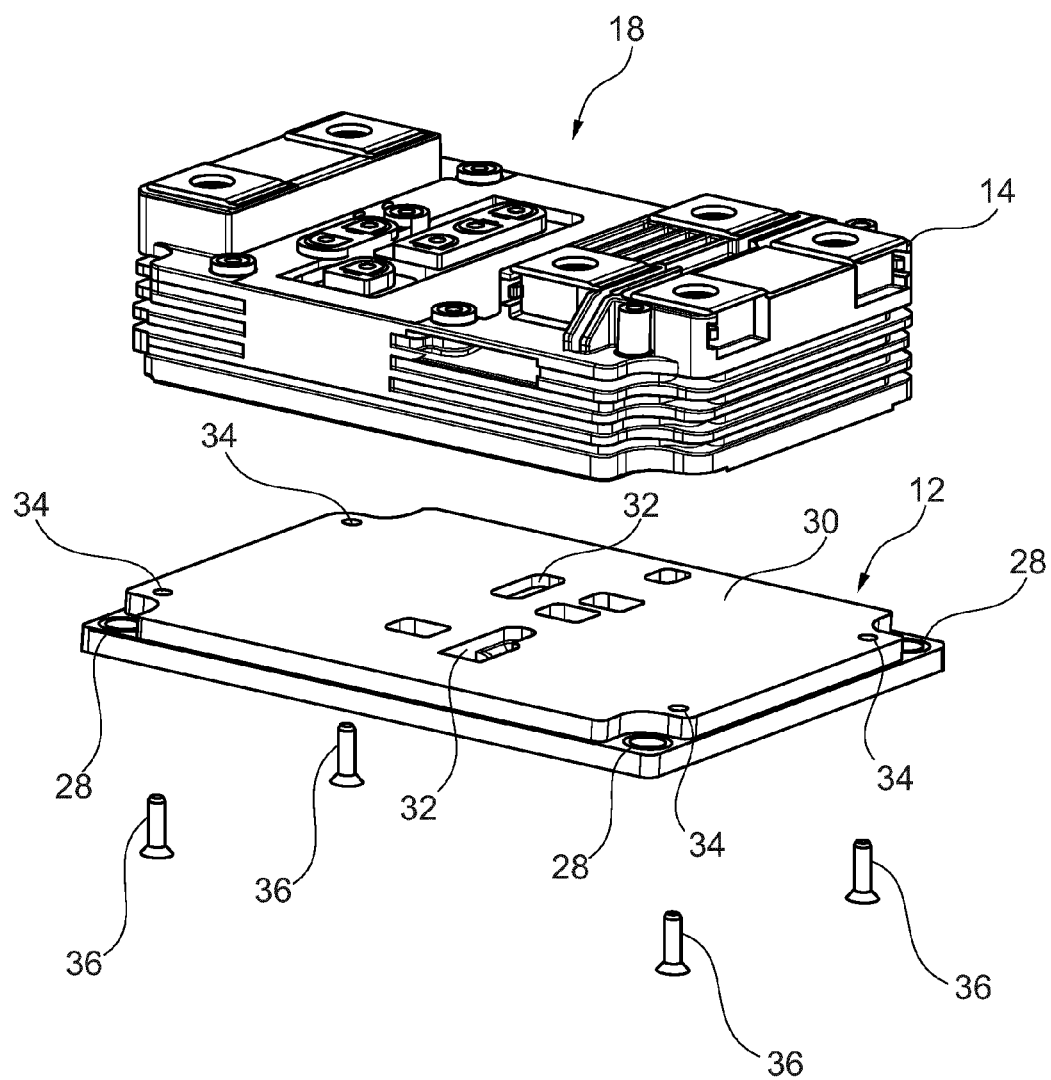
FIG. 2 shows a schematic exploded view of the power semiconductor module according to FIG. 1.
Figure 3:
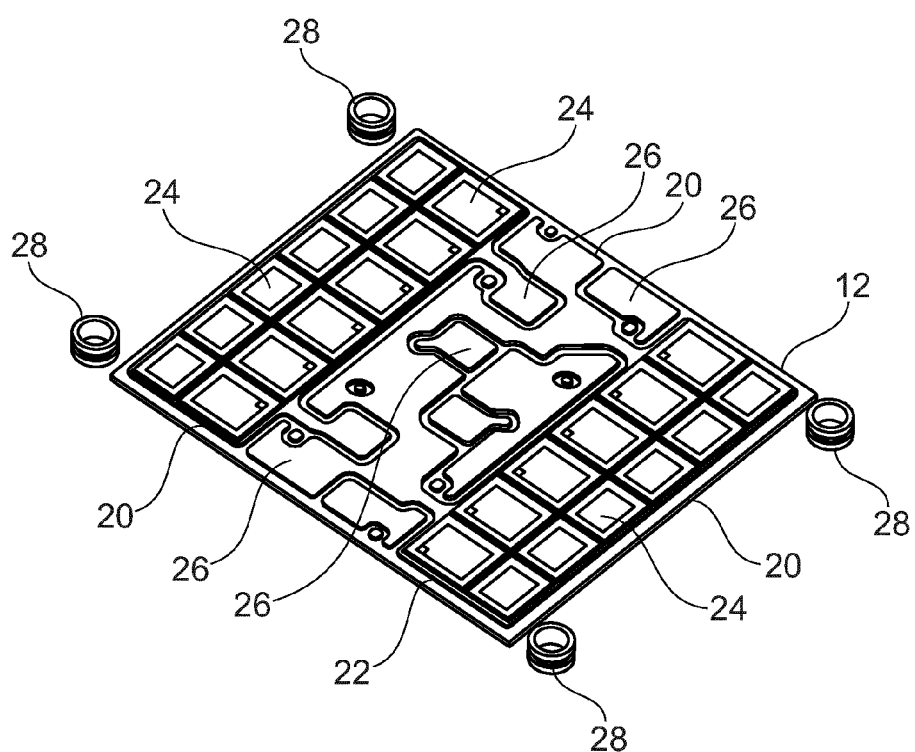
FIG. 3 shows a schematic view of a substrate according to FIG. 3 without mold compound.

Referring now to FIGS. 2 and 3, it is shown that the substrate 12 comprises an electric insulating main layer 20 such as formed from a material selected from the group consisting of aluminum oxide, aluminum nitride, and silicon nitride, being provided with a structured top metallization 22. The top metallization 22 is provided with at least one power semiconductor device 24 and at least one contact area 26. Further, fixing rings 28, or fastening rings, respectively, are provided which may be used for receiving screws, for example, for fixing screwing the substrate 12 to a cooler, for example.

It is further shown that that the substrate 12 with its main layer 20 and the top metallization 22 provided thereon is, together with the fixing rings 28, embedded in a mold compound 30 such, that the mold compound 30 comprises openings 32 for contacting the contact areas 26. The mold compound 30 may be formed from epoxy mold compound, such as epoxy resin, for example. It is clear that terminals for externally contacting the electric circuit formed on the main layer 20 and thus being part of the substrate 12 are provide in the openings 32 and fixed to the contact areas 26. Further, the mold compound 30 may be provided with through holes 34 for receiving screws in order to screw the housing 14 to the substrate 12, or the mold compound 30, respectively. It is, however, as well possible to glue the housing 14 to the substrate 12 or the mold compound 30, respectively.

All or a part of the volume which is enclosed by the housing 14 or just the openings 32 may be filled with an additional insulator, such as with silicone gel.

Figure 4:
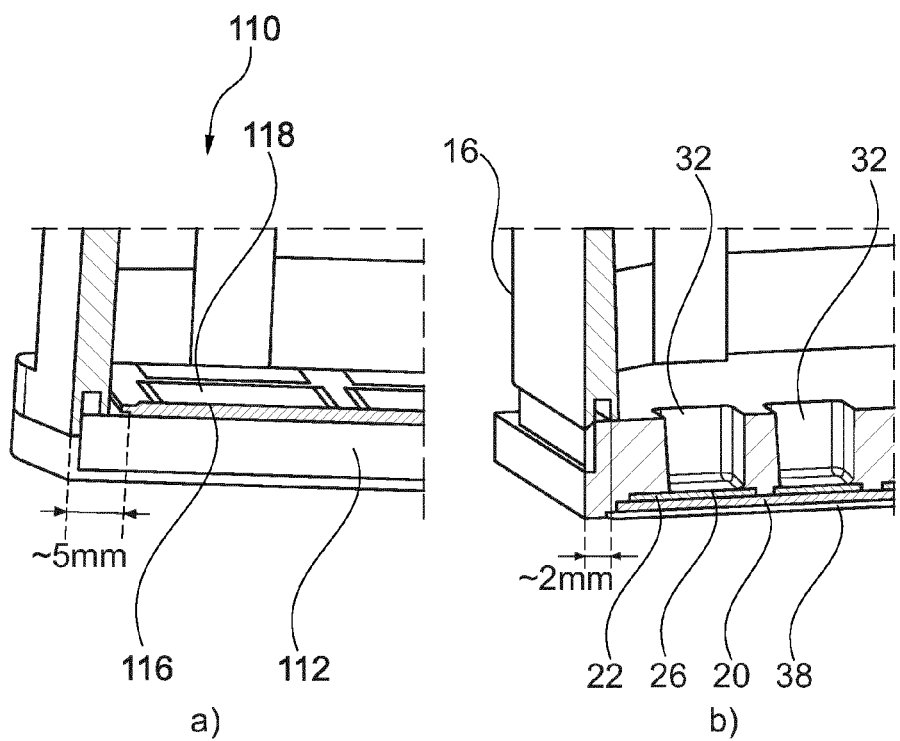
FIG. 4 shows a sectional side view of the substrate, with schematic side walls of the housing according to FIG. 1 in comparison to a prior art module.

FIG. 4 shows a positive aspect of the present invention. In detail, a sectional view of a part of a power semiconductor module 10 according to FIG. 1 is shown. Firstly, it is shown that a bottom metallization 38 is provided at the bottom side of the main layer 20 in order to contact a cooler, such as a heat sink. The bottom metallization 38 may be flush with a bottom side of the mold compound 30.

FIG. 4b) shows that the circumferential side walls 16 are connected to a top side of the mold compound 30. The circumferential side walls 16 are spaced apart from the substrate 12 by the mold compound 30 in a direction orthogonal to a plane parallel to the substrate 12. Furthermore, an extension area of the substrate 12 overlaps an extension area of the side walls 16, when projected onto a plane parallel to the substrate 12.

Further, it can be seen in FIG. 4b) that by calculating a module 10 comprising a substrate 12 according to the invention, the shown distance needed from outline of the power module 10 to the substrate 12 is about 2 mm, whereas in case a comparable power semiconductor module 110 having a substrate 112 with a metallization 116 and power semiconductor devices 118 according to the prior art would be calculated according to FIG. 4a) is provided, the respective distance is about 5 mm. Therefore, taken the distance at both sides, the total substrate area can be 6 mm larger in both directions. In other words, according to the invention, it is provided that the housing 14, or its side walls 16, respectively, may be placed directly above the main layer 20 and not next to the substrate 12 like known from the prior art. This allows that the active area of the module may be enlarged which in turn improves the performance of the power semiconductor module 10.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 10 power semiconductor module
12 substrate
14 housing
16 sidewall
18 periphery
20 main layer
22 top metallization
24 power semiconductor device
26 contact area
28 fixing ring
30 mold compound
32 opening 34 through hole
36 screw
38 bottom metallization
110 power semiconductor module
112 substrate
116 metallization
118 power semiconductor device

The invention claimed is:

1. A power semiconductor module comprising:
a substrate having an electrically insulating main layer, a top metallization positioned above the main layer, and a bottom metallization positioned below the main layer, wherein the top metallization is provided with at least one power semiconductor device and at least one contact area, wherein the electrically insulating main layer together with its top metallization and the at least one power semiconductor device is embedded in a monolithic body made of mold compound such, that the mold compound comprises at least one opening for contacting the at least one contact area; and
a housing with circumferential side walls, which are connected onto the mold compound, such that an entirety of the side walls are positioned above the main layer, wherein the circumferential side walls of the housing are connected to the monolithic body by physically contacting a peripheral region of the monolithic body with the circumferential side walls.

2. The power semiconductor module according to claim 1, wherein the circumferential side walls are spaced apart from the substrate by the mold compound in a direction orthogonal to a plane parallel to the substrate.

3. The power semiconductor module according to claim 1, wherein an extension area of the substrate overlaps an extension area of the side walls, when projected onto a plane parallel to the substrate.

4. The power semiconductor module according to claim 1, wherein the openings are filled with an electrical insulator.

5. The power semiconductor module according to claim 1, wherein fixing rings for fixing the substrate to a cooler are located in the mold compound.

6. The power semiconductor module according to claim 1, wherein the housing is connected to the mold compound by means of gluing or by means of a screw connection.

7. The power semiconductor module according to claim 1, wherein the housing is sealed against the mold compound.

8. The power semiconductor module according to claim 1, wherein the bottom metallization is partly embedded in the mold compound.

9. The power semiconductor module according to claim 1, wherein the mold compound comprises an epoxy mold compound.

10. The power semiconductor module according to claim 1, wherein at least one of the top metallization and the bottom metallization is coated with a protection coating.

11. The power semiconductor module according to claim 1, wherein at least one terminal is welded to a contact area of the top metallization.

12. The power semiconductor module according to claim 1, wherein additionally to the mold compound, a protective coating is applied around the top metallization edges.

13. The power semiconductor module according to claim 12, wherein the protective coating is formed from polyimide.

14. A power semiconductor module comprising:
a substrate having an electrically insulating main layer, top metallization positioned above the main layer, and a bottom metallization positioned below the main layer, wherein the top metallization is provided with at least one power semiconductor device and at least one contact area;
a molded body made of mold compound, wherein the electrically insulating main layer together with its top metallization and the at least one power semiconductor device is embedded in a mold compound such, that the mold compound comprises at least one opening for contacting the at least one contact area, a major surface facing away from the substrate and an opposite second surface physically contacting the substrate spaced apart by sidewalls, and a first thickness between the first major surface and the second major surface; and
a housing with circumferential side walls, which are connected onto the mold compound, such that an entirety of the side walls are positioned above the main layer, and wherein the circumferential side walls are spaced apart from the substrate by the first thickness of the mold compound in a direction orthogonal to a plane parallel to the substrate.

15. The power semiconductor module according claim 14, wherein an extension area of the substrate overlaps an extension area of the side walls, when projected onto a plane parallel to the substrate.

16. The power semiconductor module according to claim 15, wherein fixing rings for fixing the substrate to a cooler are located in the mold compound.

17. The power semiconductor module according to claim 16, wherein the housing is connected to the mold compound by means of gluing or by means of a screw connection.

18. The power semiconductor module according to claim 17, wherein the housing is sealed against the mold compound.

19. A power semiconductor module comprising:
a substrate having an electrically insulating main layer, top metallization positioned above the main layer, and a bottom metallization positioned below the main layer, wherein the top metallization is provided with at least one power semiconductor device and at least one contact area;
a base plate provided with a mold compound and configured to provide a mechanically stable arrangement for holding the substrate, wherein the electrically insulating main layer together with its top metallization and the at least one power semiconductor device is embedded in the mold compound such, that the mold compound comprises at least one opening for contacting the at least one contact area; and
a housing with circumferential side walls, wherein an entirety of the side walls are positioned above the main layer, the housing being attached to the substrate through the base plate, the circumferential side walls of the housing being aligned with circumferential sidewalls of the base plate.

20. The power semiconductor module according claim 19, wherein the base plate comprises through holes for receiving screws in order to screw the housing to the substrate.

* * * * *

UNITED STATES PATENT AND TRADEMARK OFFICE
CERTIFICATE OF CORRECTION

| | |
|---|---|
| PATENT NO. | : 11,362,008 B2 |
| APPLICATION NO. | : 16/737378 |
| DATED | : June 14, 2022 |
| INVENTOR(S) | : Trussel et al. |

It is certified that error appears in the above-identified patent and that said Letters Patent is hereby corrected as shown below:

In the Claims

Column 14, Claim 14, Lines 3-4; insert --a-- between "," and "top".

Column 14, Claim 19, Lines 40-41; insert --a-- between "," and "top".

Signed and Sealed this
Second Day of August, 2022

Katherine Kelly Vidal
*Director of the United States Patent and Trademark Office*